United States Patent
Schoefthaler et al.

(10) Patent No.: US 6,215,318 B1
(45) Date of Patent: Apr. 10, 2001

(54) MICROMECHANICAL MAGNETIC FIELD SENSOR

(75) Inventors: Martin Schoefthaler; Ralf Schellin; Harald Emmerich; Joerg Kaienburg, all of Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/336,628

(22) Filed: Jun. 18, 1999

(30) Foreign Application Priority Data

Jun. 18, 1998 (DE) .............................................. 198 27 056

(51) Int. Cl.[7] .................................................. G01R 27/26
(52) U.S. Cl. ............................................................ 324/658
(58) Field of Search ............................... 324/658, 207.24, 324/207.21, 256, 260; 356/429, 431, 435, 73; 257/415, 369, 414, 431, 618

(56) References Cited

U.S. PATENT DOCUMENTS 5,818,227 * 10/1998 Payne et al. .......................... 324/259
6,025,208 * 2/2000 Chui et al. .............................. 438/50

OTHER PUBLICATIONS

Beverley Eyre and Kristofer S. J. Pister., "Micromechanical Resonant Magnetic Sensor in Standard CMOS", 1997 IEEE, pp. 405–408.

Michael J. Caruso., "Applications of Magnetoresistive Sensors in Navigation Systems", 1997, SAE Technical Paper Series 970602, pp. 15–21.

Kadar et al., "Integrated Resonant Magnetic–Field Sensor", Sensors and Actuators A, 41–42 (1994), 66–69.

R. Gottfried–Gottfried et al., "A Miniaturized Magnetic–Field Sensor System Consisting of a Planar Fluxgate Sensor and a CMOS Readout Circuitry", Sensors and Actuators A 54 (1996), 443–447.

* cited by examiner

*Primary Examiner*—Safet Metjahic
*Assistant Examiner*—E. P. Le Roux
(74) *Attorney, Agent, or Firm*—Kenyon & Kenyon

(57) ABSTRACT

A micromechanical magnetic field sensor includes a printed circuit trace device, which is suspended above a substrate and is capable of being deflected elastically. Also included are a first capacitor plate device that is joined to the printed circuit trace device and is able to be deflected together with the printed circuit trace device, and a second, fixed capacitor plate device that is joined to the substrate and forms a capacitor device by interacting with the first capacitor plate device. A magnetic field sensing device conducts a predetermined current through the printed circuit trace device and measures the change in capacitance of the capacitor device arising in dependence on an applied magnetic field. The magnetic field sensing device can also be designed in such a way that it can be calibrated by calibration current loops.

18 Claims, 4 Drawing Sheets

MICROMECHANICAL MAGNETIC FIELD SENSOR

FIELD OF THE INVENTION

The present invention relates to a micromechanical magnetic field sensor.

BACKGROUND INFORMATION

From the related art, various micromechanical magnetic field sensors are known, which convert an interaction between an electric current and a magnetic field into a force, based on the Lorentz force acting on electric charges. This force acting on the magnetic field sensor structure causes a deflection, which can be detected by various methods.

To illustrate the related art, first three rocker-shaped sensor structures will be described.

The first known magnetic field sensor structure is a resonant $SiO_2$-torsion rocker, as is known from B. Eyre and K. S. J. Pister, Micromechanical Resonant Magnetic Sensor in Standard CMOS, Transducers 97, 1997 Int. Conf. Solid-State Sensors and Actuators, Chicago, Jun. 16–19, 1997.

In this design approach, an aluminum loop is generated on a freely suspended $SiO_2$-rocker structure. As a result an electromagnetic excitation (alternating current interacting with the magnetic field) having the mechanical resonant frequency of the vibrator, a mechanical torsional vibration ensues. The amplitude is detected using a piezoresistive Wheatstone bridge circuit. Due to the high attenuation of the structure ($SiO_2$—Al), only low qualities (i.e., high attenuation values) are achieved even under vacuum, namely qualities in the range of Q=10. Due to the thin substrates (particularly $SiO_2$), the rocker structure bends considerably under the action of a force.

The second known magnetic field sensor structure is a resonant monocrystalline torsion rocker as is known from Z. Kadar, A. Bossche and J. Mollinger, Integrated Resonant Magnetic Field Sensor, Sensors and Actuators A, 41–42, (1994), pp. 66–69.

This magnetic field sensor is composed of a monocrystalline rocker structure suspended on torsion bars, printed circuit traces of aluminum being deposited on the structure. As before, an alternating current having the resonant frequency of the mechanical torsional vibrator is sent through the printed circuit trace. A vibrational amplitude (angle of torsion) arises which is read out capacitively via separate electrodes. The counter-electrode is formed by a patterned, conductive layer, which is deposited on a glass cap having depressions (cavities). The resonant method and the low "structural attenuation" of the vibrator supposedly make it possible to measure magnet fields in the nT range due to a possible vacuum enclosure and the resulting high qualities. In addition, a large dynamic range is indicated by the authors. Feedback printed circuit traces and a synchronous detector (carrier-frequency method) are used for the capacitive readout. The sensor design approach implemented in the laboratory has rest capacities in the range of 0.5 pF. The corresponding manufacturing process is hardly suited for inexpensive series production due to the complicated (and expensive) process steps. This publication does not reveal how the described crossover of printed circuit traces is implemented.

The third known magnetic field sensor structure is a non-resonant design approach, in which a direct current flows through one half of a silicon rocker structure (no separately applied printed circuit traces), the direct current interacting with the magnetic field and producing a Lorentz force. This force is converted into a torsional moment, which then twists the rocker structure. The changes in capacitance of the rocker areas toward the lower-lying counter-electrodes resulting from this torsion are read out using a capacitive method of measurement.

Furthermore, there are magnetic field sensors, which are based on electromagnetic material effects.

For example, the Hall effect is utilized. The Fall effect occurs in current-carrying conductors in the presence of an external magnetic field. The electrons are deflected perpendicularly to their moving direction depending on the current-carrying material. This deflection produces a potential difference between the two sides of the conductor, the potential difference representing the measured Hall effect. The following disadvantages can be enumerated regarding Hall-effect sensors: highly limited resolution (usual resolution limits lie in the mT range), a highly limited dynamic response, a great offset and a high temperature dependence of the measured effect.

Other sensors, which are based on electromagnetic material effects, include magnetoresistive sensors, in which the electrical resistance increases in the presence of a magnetic field (see, for example, M. J. Caruso, Applications of Magnetoresistive Sensors in Navigation Systems, 1997 Society of Automotive Engineers, Inc., Publ. # 970602, pp 15–21).

Fluxgate sensors, in which the sensor and the electronic unit are usually provided on one chip, some of them having a high resolution of typically 9 $mV/\mu T$, were disclosed, for example, by R. Gottfried—Gottfried, W. Budde, R. Jähne, H. Kück, B. Sauer, S. Ulbricht and U. Wende, A Miniaturized Magnetic Field Sensor System Consisting Of A Planar Fluxgate Sensor And A CMOS Readout Circuitry, Sensors and Actuators A54 (1996), pp. 443–447.

With regard to the above known approaches it turned out to be disadvantageous that the magnetic field sensors have either a low resolution, i.e., sensitivity, or a high-temperature-dependent offset, or that their production is very costly.

SUMMARY OF THE INVENTION

The idea, on which the present invention is based, is that a motion of the sensor structure caused by the Lorentz force is detected by electrodes, preferably comb-like ones. In this process, the Lorentz force is utilized in that a current impressed upon a (freely suspended) electric conductor and an externally applied magnetic field cause the freely suspended structure to move laterally.

The use of fixed electrode combs (fixed comb structure) and movable electrode combs (movable comb structure), which are preferably manufactured by known silicon surface micromachining, makes it possible to produce a motion-dependent change in capacitance.

The combs can be arranged parallel or vertical with respect to the direction of motion (i.e., parallel or vertical with respect to the conductor direction, respectively). The combs have a uniform electrical potential, which considerably simplifies the electro-capacitive readout of the motion. A design approach of this kind is not known since in all known design approaches, the electrical potential of the movable electrode is locus-dependent.

The potential can be tapped by an additional, preferably soft spring, and be used, for example, for an electrical control.

In the capacitive detection of the sensor motion by a capacitive measuring method, the change in distance between fixed and movable electrode combs is converted into an electrical signal, i.e., the area overlap between fixed and movable electrode combs produces a change in capacitance. By the capacitive readout of the amplitude signal, a low temperature sensitivity and a low temperature hysteresis is expected.

The sensor can be used for static and dynamic, particularly resonant operating modes, i.e., a deflection of the sensor structure by a direct current or an alternating current in the magnetic field. In one case, a static deflection results; in an other case, a vibratory movement. In the dynamic operation in combination with a capacitance differential measuring method, transverse accelerations are negligible, depending on the mechanical resonance frequency in each case.

Furthermore, there is the possibility of a vacuum enclosure for the dynamic operation to increase the vibration quality, and consequently, to improve the sensitivity compared to static systems. Compared to static methods of measurement, the operation under a vacuum atmosphere allows a considerably higher sensitivity (high vibration amplitudes combined with high quality by resonance amplification). To detect alternating magnetic fields, a direct current can be sent through the structure instead of an alternating current.

The micromechanical magnetic field sensor according to the present invention has the particular advantage over the known design approaches that it has a high magnetic field resolution, namely in the $\mu T$ range, that it has small size, and that it can be manufactured inexpensively by standard surface micromachining.

This series production process is a process, which is known from the production of acceleration sensors having comb patterns. The use of surface micromachining, particularly the series production process using a thick epitaxial poly-layer, enables a rigid sensor structure to form, by which a low cross sensitivity can be achieved. Furthermore, surface micromachining facilitates a two-wafer design approach (sensor and cap) instead of a three-wafer design approach (as is known from Z. Kadar, A. Bosche and J. Mollinger, Integrated Resonant Magnetic Field Sensor, Sensors and Actuators A, 41–42, (1994), pp. 66–69).

Further advantages of the magnetic field sensor according to the present invention are the possibilities of allowing the sensor structure to move laterally and of carrying out a resonant operation having a high quality, and consequently, an increase in sensitivity.

According to a preferred embodiment, the printed circuit trace device has a first elongated beam running in a first direction, being elastically suspended at its ends in a corresponding spring device over the substrate, basically being able to be deflected in a second direction only. The advantage of this is that only forces acting in the second direction must be considered in the evaluation.

According to a further preferred embodiment, the printed circuit trace device has an elongated second and third beam branching from the first beam basically vertical with respect to and running over the substrate in opposite directions. These second and third beams are preferably used for anchoring the movable first capacitor plate device. The opposite branch enables the capacitor plates of the movable first capacitor plate device to be all basically at the same potential.

According to a further preferred embodiment, the first capacitor plate device has a multitude of beams branching from the second and third beams and running over the substrate basically parallel or vertical with respect to the first beam.

According to a further preferred embodiment, the second and/or the third beam is/are suspended (preferably softly) above the substrate at the end that is distant from the first beam so that an electrical potential can be tapped at it at the end via the suspension, a uniform electrode potential being preferably provided. Tapping the potential makes it possible to monitor, or to control the comb potential via the potentials at the power supply conductors of the printed circuit trace device.

According to a further preferred embodiment, the second capacitor plate device has a multitude of beams, which are anchored in the substrate at one end and arranged in such a way that they form a differential capacitor device by interacting with the first capacitor plate device. In this way, the capacitance differential method as known from acceleration sensor engineering, or a modified one, can be used for the evaluation.

According to a further preferred embodiment, the magnetic field sensing device is designed in such a way that it conducts a direct current through the printed circuit trace device, and detects an applied magnetic field through a static change in capacitance.

According to a further preferred embodiment, the magnetic field sensing device is designed in such a way that it conducts an alternating current, preferably having the natural mechanical frequency of the deflectable components, through the printed circuit trace device, thereby sensing an applied magnetic field via a dynamic change in capacitance. This method makes possible a higher resolution (particularly in the case of the resonant frequency) and the elimination of static interference effects.

According to a further preferred embodiment, a conductive layer, e.g., a doped polysilicon or an aluminum layer, is deposited at least on the elongated first beam of the printed circuit trace device. The resulting advantage is that the resistance of the printed circuit trace device can be adjusted in a controlled way.

According to a further preferred embodiment, a provision is made on the surrounding substrate for a calibration current loop, by which a calibrating magnetic field can be impressed. Thus, temperature influences or magnetic interference fields can be eliminated by corresponding reference measurements.

DETAILED DESCRIPTION

Figure 1:
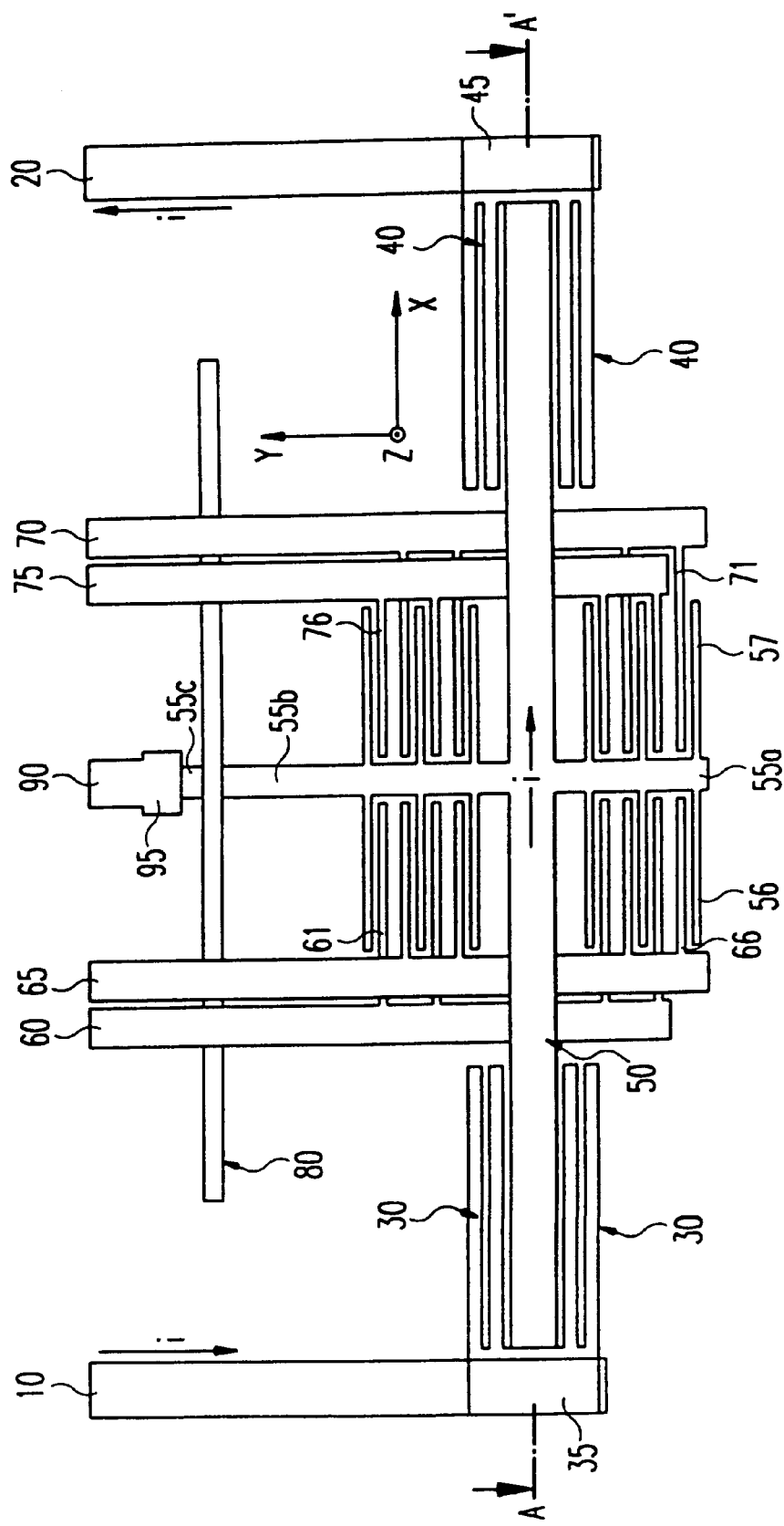
FIG. 1 shows a schematic top view of a first embodiment of the micromechanical magnetic field sensor according to the present invention.
Figure 2:
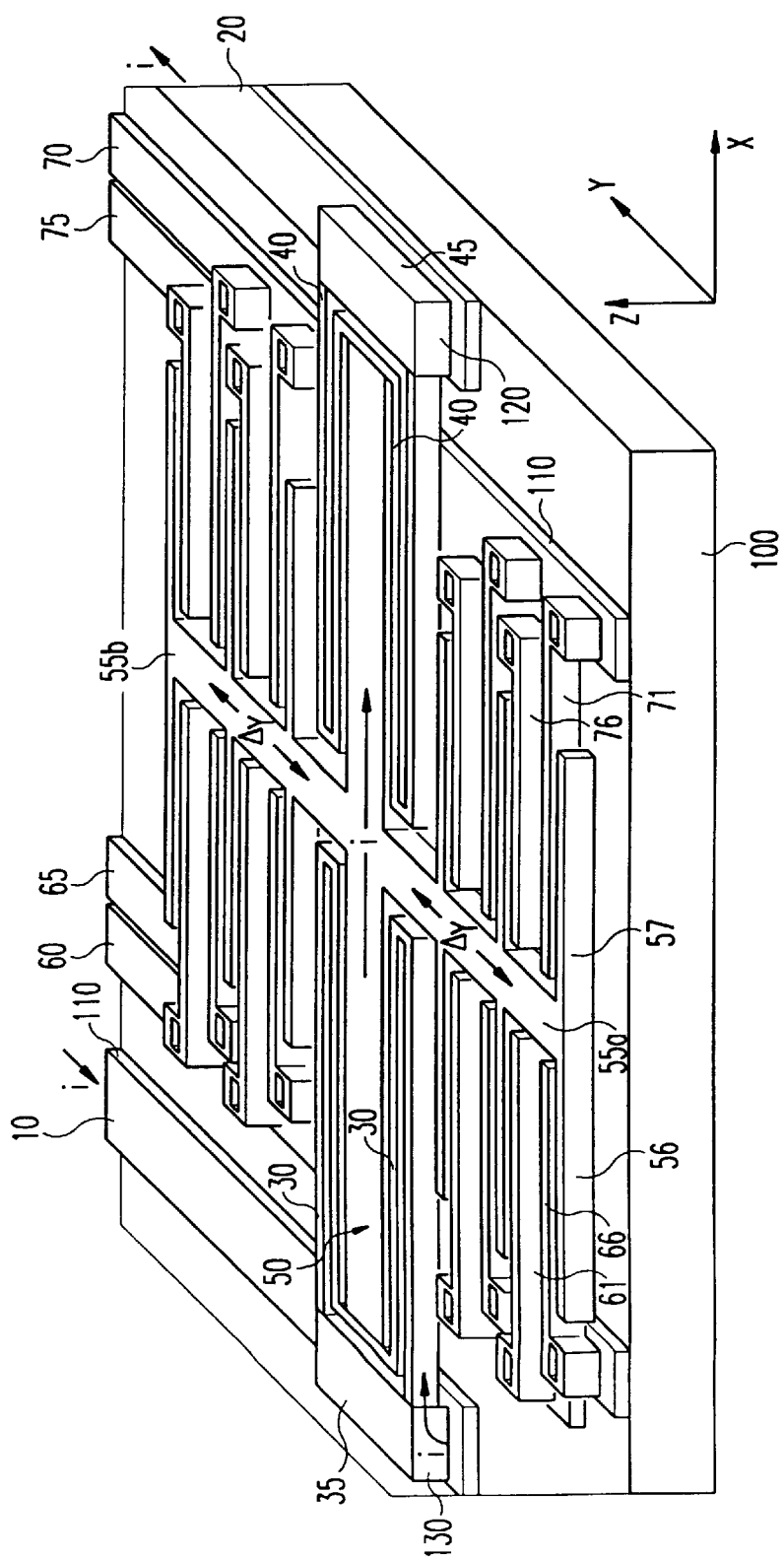
FIG. 2 shows a schematic, perspective view of the first embodiment of the micromechanical magnetic field sensor according to the present invention.

FIG. 1 is a schematic top view of a first embodiment of the micromechanical magnetic field sensor according to the present invention and FIG. 2 is a corresponding schematic, perspective view.

In FIGS. 1 and 2, respectively, reference symbols 10, 20 refer to power supply conductors; 30, 40 to spring devices; 35, 45 to anchorages; 50 to a printed circuit trace device in the form of a first beam; 55a, 55b to a second and third beam, respectively; 55c to a fourth beam; 56, 57 to movable capacitor plates, 60, 65, 70, 75 to electrical connections for fixed capacitor plates; 61, 66, 71, 76 to fixed capacitor plates; 80 to a spring device; 90 to an electrical connection; 95 to an anchorage; 100 to a substrate of silicon; 110 to a first insulating layer of silicon dioxide; 120 to a first conducting layer of buried polysilicon; 130 to a second conducting layer of epitaxial polysilicon; X, Y, Z to directions, Δy to a deflection and A, A' to a cutting direction with regard to FIG. 3.

The embodiment according to FIGS. 1 and 2 has a symmetrical, expediently perforated vibrator structure, which is suspended movably at two ends via spring devices 30, 40.

This perforated vibrator structure is composed of the printed-conductor-shaped first beam 50 (printed circuit trace device) between spring devices 30, 40, and the second and third beams 55a, 55b, branching from the middle of this first beam 50, including the comb-shaped movable first capacitor plate comb structure 56, 57 branching from beams 55a and 55b.

The vibrator structure is mechanically connected with Si-substrate 100 via spring devices 30, 40, the first conducting layer 120 and the first insulating layer 110 (e.g., made of thermal oxide), an electrical connection existing to power supply conductors 10, 20 executed in the first conducting layer 120. Spring devices 30, 40, which are represented in a meander form here (but can also have another suitable geometry), are designed in such a way that they represent a relatively soft suspension in y-direction. On the other hand, the vibrator structure can only be deflected with difficulty in x- or z-direction, respectively, due to a rigid design of the spring elements.

Both movable printed circuit trace device 50 and capacitor plate comb structure 56, 57, connected thereto, are dimensioned sufficiently rigidly to resist bending and twisting, which would cause interfering modes.

The second capacitor plate comb structure is linked to substrate 100 via first conducting layer 120 and first insulating layer 110, mechanically fixed and electrically insulated, the comb structure having a multitude of beams 61, 66, 71, 76, which are arranged in such a way that, with the first capacitor plate comb structure 56, 57, they form a differential capacitor device such as is well known from acceleration sensors, and is therefore not further explained here. An electrical connection exists to electrical connections 60, 65, 70, 75 executed in the first conducting layer 120.

Spring device 80, which engages with the movable vibrator structure and makes it possible to tap the electrical potential via connection 90 is depicted only in FIG. 1 (not in FIG. 2 for reasons of clarity). In this context, the spring constant of spring device 80 can be considerably lower than that of spring devices 30, 40. The latter can be achieved by a greater bending radius and/or a smaller width.

The functioning of the embodiment illustrated in FIGS. 1 and 2 is further explained in the following.

A current I is conducted into the vibrator structure via power supply conductor 10. Current I flows into the fixed epitaxial polysilicon of anchorage 35 via the printed circuit trace in conducting layer 120. Through the epitaxial polysilicon, current I reaches spring device 30, further into the vibrator structure, i.e., through printed circuit trace device 50, and finally through the opposite spring device 40 and anchorage 45, and from there via the printed circuit trace in conducting layer 120 to the other power supply conductor 20.

When an impressed current I and an external magnetic field B are present simultaneously, a Lorentz force acts on printed circuit trace device 50.

Lorentz force F resulting from an external magnetic field B and an impressed current I through printed circuit trace device 50 (printed circuit trace length l), follows from the following vector equation:

$$F = l \times B \quad (1)$$

Lorentz force F being at right angles to both the impressed current I and the magnetic field B. In vector component notation, it follows:

$$F_x = 1 \cdot (i_y B_z - i_z B_y) \quad (2)$$

$$F_y = 1 \cdot (i_z B_x - i_x B_z) \quad (3)$$

$$F_z = 1 \cdot (i_x B_y - i_y B_x) \quad (4)$$

Since there is only one current component $i_x$ in x-direction within printed circuit trace device 50 (the others are either zero or cancel each other out), one can write in a simplified way:

$$F_x = 0 \quad (2')$$

$$F_y = 1 \cdot (-i_x B_z) \quad (3')$$

$$F_z = 1 \cdot (i_x B_y) \quad (4')$$

Therefore, active forces arise only if both a magnetic field and a current are applied, in fact, only at right angles to the x-direction (current direction). Without the magnetic field, there are no forces acting on the vibrator structure, except for the weight (or possible accelerative forces).

The force acting on the vibrator structure is counteracted by the spring restoring force of "interconnected" spring devices 30, 40, 80.

Then, a deflection Δy depending on the spring restoring force and the Lorentz force acting in y-direction $F_y = 1 \cdot (-i_x B_z)$ arises. A deflection Δz does not enter into the measuring signal, or rather is negligible due to the rigid spring design of this embodiment in z-direction. Deflection Δy can then be electrically determined via the movable capacitor plate comb structure 56, 57 and the fixed capacitor plate comb structure 61, 66, 71, 76. During deflection Δy, the distance between the teeth, i.e., fingers of the movable capacitor comb, and the teeth of the fixed capacitor comb decreases by Δy on one side, while on the other side, the distance increases by Δy. This change in distance produces a change in capacitance of the capacitor device formed in this manner, the change in capacitance being able to be determined with measuring techniques such as a capacitance differential measuring method. By connecting several comb teeth in parallel, a higher overall capacity (change) is achieved, which is easier to be measured.

Due to the branching of the vibrator structure toward the movable comb structures at the same place of printed circuit trace device 50, these movable comb structures have the same electrical potential all over. This simplifies the electronic evaluation considerably.

The electronic excitation and evaluation can either be performed statically or dynamically.

In the static operating mode, a direct current is sent through the vibrator structure. The Lorentz force arising in the presence of an external magnetic field is counteracted by the force exerted by spring devices 30, 40 (in which the vibrator structure is movably suspended). When the equilibrium of forces with spring devices 30, 40 is reached, a static lateral deflection Δy of the freely suspended vibrator structure ensues, which can be electrically determined, e.g., by a capacitance differential measuring method.

In the dynamic operating mode, an alternating current is expediently conducted through printed circuit trace device 50, the current oscillating in the resonant frequency of the mechanical spring-mass system ("amplitude resonance frequency"). Nevertheless, a sub-critical excitation frequency is also possible, which is less responsive to the enclosed air pressure and the exact tuning of the electrical excitation frequency to the mechanical resonant frequency. In addition, the frequency of the alternating current can be exactly regulated and maintained at the amplitude resonance by an electrical feedback of the vibratory movement.

When an external magnetic field is applied, then an also oscillating force acts on printed circuit trace device 50. After the transient recovery time of the mechano-electrical vibrator system, a mechanical vibrational amplitude ensues, which depends on the attenuation (i.e., the quality), which is primarily determined by the internal-pressure dependent air friction, and the measured magnetic field component $B_z$ pertaining to the impressed current. The mechanical vibratory movement can also be measured capacitively via the comb structure (e.g., using a carrier-frequency measuring method).

Static deflections resulting from the gravitational acceleration do not enter into the measuring signal in the first approximation due to the rigid structure and the dynamic measuring method, provided that a suitable resonant frequency is selected.

By using the amplitude magnification at the resonant frequency, the resonant method also permits a considerably higher resolution, i.e., sensitivity, than the static method, i.e., the same applied external magnetic field produces a greater maximum deflection of the vibrator structure.

If a charge amplifier is used, the electrical capacitance measurement can be considerably simplified by a defined potential of the movable comb structure. This potential can be tapped appropriately by a preferably soft spring device 80. In the case of electrical asymmetries (resistance of the printed circuit traces, etc.), tapping the potential makes it possible to regulate the comb potential via the input voltages (potentials at the two power supply conductors 10, 20).

Figure 3:
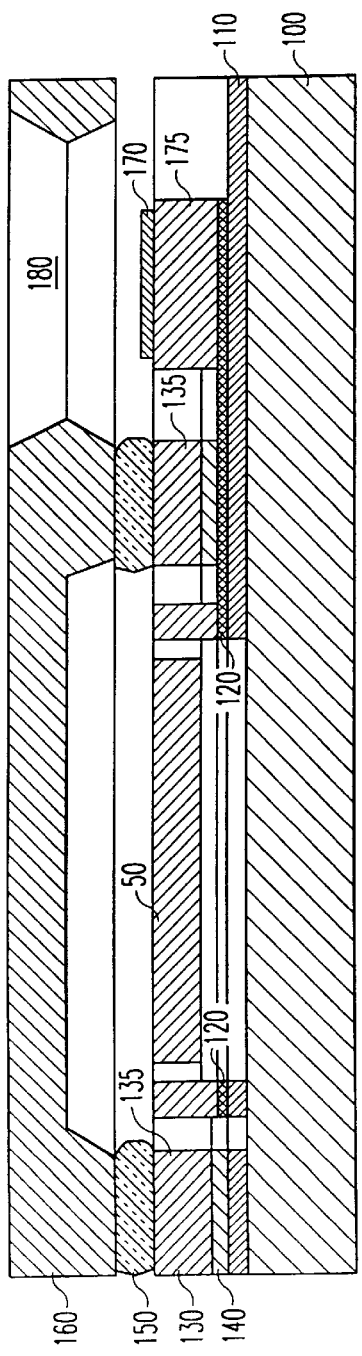
FIG. 3 shows a schematic sectional view of an encapsulated sensor structure using the first embodiment of the micromechanical magnetic field sensor according to the present invention, viewed along line A–A' in FIG. 1.

FIG. 3 is a schematic sectional view of an encapsulated sensor structure using the first embodiment of the micromechanical magnetic field sensor according to the present invention, viewed along line A–A' in FIG. 1.

In FIG. 3, in addition to the reference symbols introduced earlier, 135 refers to a base; 140 to a second insulating layer of silicon dioxide; 150 to a solder glass; 160 to a cap in the form of a silicon wafer; 170 to a third conducting layer of aluminum for a bonding pad; 175 to a bonding pad base and 180 to a bonding pad opening.

With reference to FIG. 3, the process for manufacturing the micromechanical magnetic field sensor according to the present invention is further explained.

First of all, the first insulating layer 110 of silicon dioxide is deposited, i.e., deposited by epitaxial growth, and patterned on the provided substrate 100.

On that insulating layer 110, first conducting layer 120 of LPCVD-polysilicon (to be buried) for forming the electrical connections for printed circuit trace device 50 and the capacitor device is deposited and patterned.

Then, the second insulating layer 140 of silicon dioxide is deposited and patterned on the resulting pattern.

To form printed circuit trace device 50 and the capacitor device, the second conducting layer 130 of epitaxial polysilicon is then deposited and patterned on the resulting pattern. Base 135 for cap wafer 160 as well as bonding pad base 175 are also formed from this second conducting layer 130.

By undercutting the oxide of deflectable components 30, 40, 50, 55a, 55b, 56, 57, these are allowed to freely move above substrate 100.

Finally, the deflectable components 30, 40, 50, 55a, 55b, 56, 57 are encapsulated. The encapsulation process is shown here by the example of a solder glass joining technique. By this technique, one can hermetically encapsulate sensors and enclose a vacuum at the same time (by which the quality, i.e., the attenuation, can then be adjusted). However, the encapsulation can also be carried out using other techniques, for example, anodic bonding.

Figure 4:
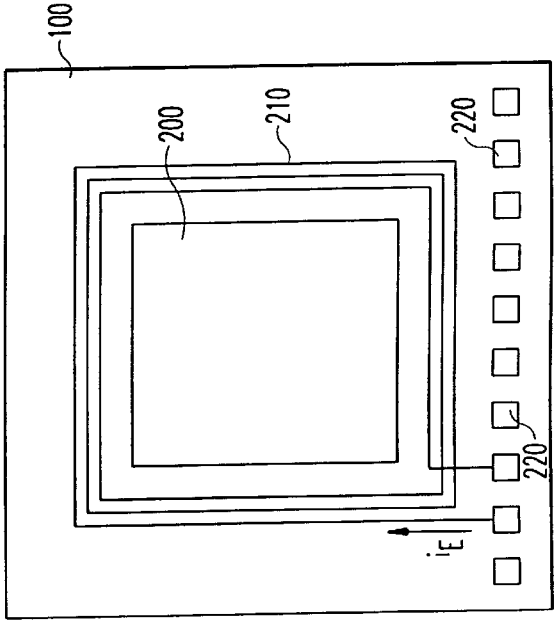
FIG. 4 shows a schematic, perspective view of a second embodiment of the micromechanical magnetic field sensor.

FIG. 4 is a schematic, perspective view of a second embodiment of the micromechanical magnetic field sensor according to the present invention.

In FIG. 4, in addition to the reference symbols introduced earlier, 200 refers to the above explained micromechanical magnetic field sensor structure, explained above, as a functional block, 210 to a calibration current loop, 220 to bonding pads and $i_E$ to a calibration current.

Described above was a micromechanical magnetic field sensor structure 200, which can be operated in resonant or non-resonant mode to detect an external magnetic field.

Particularly in the resonant case, detected voltage signal U, which is a function of detection capacitance C between the comb electrodes, depends not only on the external magnetic field but also on the quality, i.e., the attenuation, of the vibrating system.

The detection capacitance C, in turn, is a function of time in the resonant operation having the resonant frequency $f_{res}$, in which $t=1/f_{res}$, of the magnetic field $B_{90°}$ being at right angles to the current-carrying conductor, and of the quality Q, which is, inter alia, a function of the air pressure surrounding the vibrator; therefore, the following equation applies:

$$C=f(t, B_{90°}, Q) \qquad (5)$$

Since, above all, the air pressure cannot be exactly adjusted due to process fluctuations during the enclosure of the vacuum, and, in addition, since the air pressure changes depending on the ambient temperature, it is expedient to use a calibration reference, by which the measured value is calibrated.

The present embodiment according to FIG. 4 also makes use of calibration current loop 210, which is arranged around magnetic field sensor structure 200. The execution of calibration current loop 210 and the crossovers in the technical production process are expediently performed in different planes using standard techniques, for example, using buried polysilicon, epitaxial polysilicon, and aluminum.

A constant calibration current $i_E$ is impressed upon this calibration current loop 210 via two bonding pads 220. By this flow of calibration current, calibration current loop 210 generates a constant calibrating magnetic field in its center, i.e., in the entire interior of the loop. Since active sensor structure 200 is located in the interior of calibration current loop 210, a corresponding measuring effect can be achieved in impressed measuring current I.

Since constant calibration currents $i_E$ can relatively easily be generated so as to be temperature-stable, consequently, a magnetic field can be generated which does not depend on quality Q or the ambient temperature.

By switching on or reversing calibration current $i_E$ in certain intervals, the magnetic field sensor can be calibrated via the change of the output signal during the closing operation. The alternating excitation current, for example, can be readjusted by the printed circuit trace device with regard to its amplitude to exhibit a particular measuring amplitude in a particular calibrating magnetic field.

By a single calibration operation, the output signal can be brought to the set-point value at the prevailing internal cavity pressure, which, as mentioned before, is subject to process fluctuations. By cyclical closing operations, the influence of the temperature on the internal cavity pressure can be eliminated electronically.

Furthermore, calibrations are conceivable in which possible ambient fields, such as the geomagnetic field, are screened off.

Figure 5:
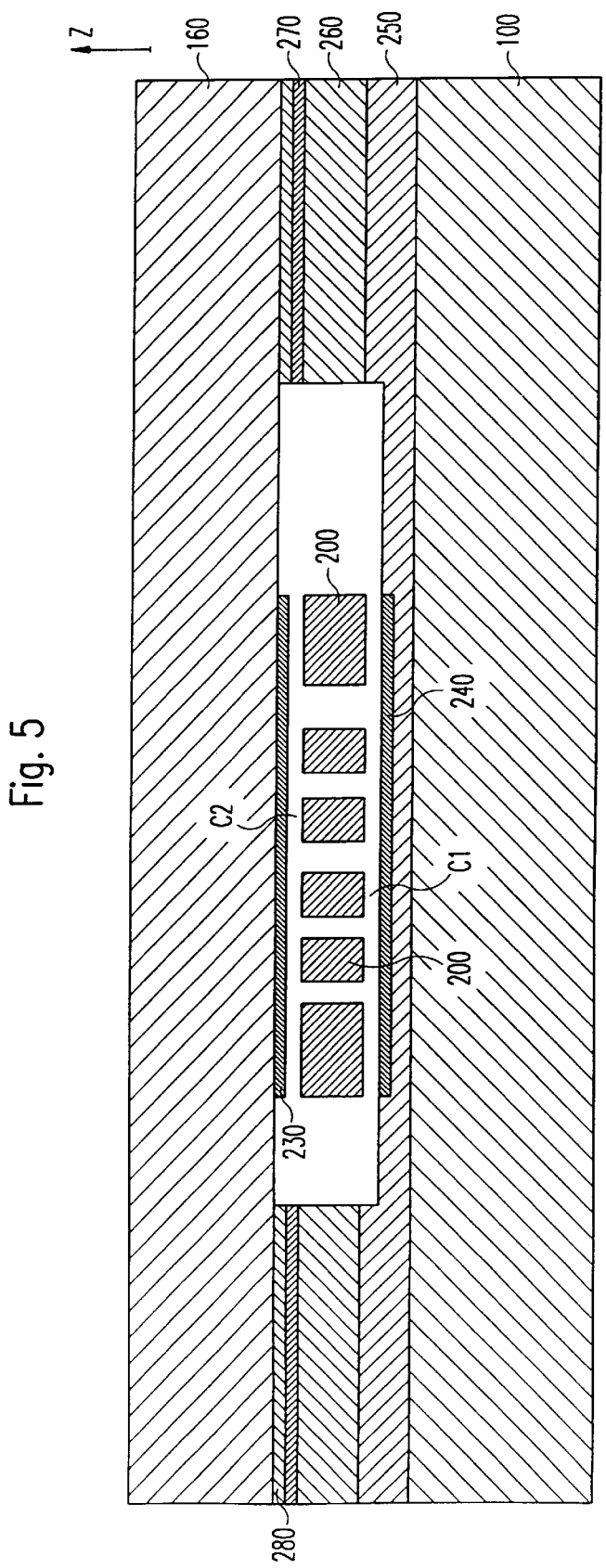
FIG. 5 shows a schematic, perspective view of a third embodiment of the micromechanical magnetic field sensor.

FIG. 5 shows a schematic, perspective view of a third embodiment of the micromechanical magnetic field sensor according to the present invention.

In this third embodiment, the suggested measuring principle is extended into a second dimension (axis). While in the first and second embodiment, described above, a lateral movement, which is caused by a magnetic field and a current impressed upon a movable conductor, is detected capacitively via resulting deflection Δy of the sensor structure, a deflection Δx of the sensor structure is detected in the third embodiment.

To this end, the spring arrangement is designed in such a way that an additional soft spring is provided in z-direction. Thus, the z-deflection, and consequently, a second axis of an applied magnetic field can, in principle, also be detected capacitively.

In FIG. 5, 200 refers to a magnetic field sensor structure according to the first or second embodiment, respectively, having lateral comb electrodes and a spring suspension to an anodically bonded substrate wafer 100, the sensor structure having a patterned metal layer 230, a buried polysilicon layer 240, an oxide layer 250, an epitaxial polysilicon layer 260, a buried masking layer 270, a further epitaxial polysilicon layer 280, and the already introduced cap 160.

Here, the buried polysilicon layer referred to by 240 is used as a first electrode to detect the magnetic field in z-direction, C1 being the capacitance between buried polysilicon layer 240 and movable printed circuit trace device 50, i.e., the lateral electrodes and the separately provided areas having the same uniform potential as the other movable electrodes, respectively.

The patterned metal layer 230 on glass wafer cap 160 is used as a second electrode to detect the magnetic field in z-direction, C2 being the capacitance between patterned metal layer 230 and movable printed circuit trace device 50, i.e., the lateral electrodes and the separately provided areas having the same uniform potential as the other movable electrodes, respectively.

The connections to buried polysilicon layer 240 and patterned metal layer 230 are not depicted for reasons of clarity.

If the distances between the movable magnetic field sensor structure and buried polysilicon layer 240 and patterned metal layer 230, respectively, are preferably selected to be equal, then the differential capacitor principle can be used in the measuring technique in this case as well, since a deflection in z-direction decreases one capacitance, C1, and increases the other capacitance, C2.

Sensor wafer 100, for example, is produced in a customary process. Cap wafer 160 can be made by sputtering or evaporation coating of metal layer 230 and a subsequent patterning. The patterning is created in being removed in the anodic bonding area and left in the electrode and contacting area. After that, the anodic bonding between wafers 100, 160 is carried out.

This process has been explained as an example only. Other processes are also conceivable, for example, patterning of a silicon cap, insulated electrodes being inserted to manufacture the upwardly directed electrodes.

If two preferably identical sensor structures, which are deflectable in z-direction, are arranged in the wafer plane, rotated by 90° relatively to each other, at least one sensor structure thereof being able to additionally detect lateral deflections, then the magnetic field can be determined in all three axes x, y and z.

Although the present invention has been explained above on the basis of a preferred exemplary embodiment, it is not limited to it but capable of being modified in many ways.

In particular, the geometry of the capacitor device is not limited to the depicted embodiment but can be varied considerably.

Furthermore, not only static magnetic fields but also oscillating magnetic fields can be measured using the micromechanical magnetic field sensor according to the present invention, in fact, both statically and dynamically.

The sensor can be used not only to measure magnetic fields, but also for applications which use magnetic measuring effects but do not reproduce the magnetic quantity directly (e.g., speed of rotation measurement, goniometry, end switches, etc.).

Furthermore, a conductive layer, e.g., doped polysilicon or an aluminum layer can be deposited on the first elongated beam 50, to reduce its resistance in a controlled way.

Finally, the mentioned materials are only selected as examples, being, of course, replaceable with other suitable materials.

MICROMECHANICAL MAGNETIC FIELD SENSOR

List of Reference Symbols:

| | |
|---|---|
| 10, 20 | power supply conductor |
| 30, 40 | spring device |
| 35, 45 | anchorage |
| 50 | printed circuit trace device, first beam |
| 55a, 55b | second, third beam |
| 55c | fourth beam |
| X, Y, Z | directions |
| Δy | deflection |
| A, A' | cutting direction |
| 56, 57 | movable capacitor plates |
| 60, 65, 70, 75 | electrical connections for fixed capacitor plates |
| 61, 66, 71, 76 | fixed capacitor plates |
| 80 | additional spring device |
| 90 | electrical connection |
| 95 | anchorage |
| 100 | substrate |
| 110 | first insulating layer |
| 120 | first conducting layer |
| 130 | second conducting layer |
| 135 | base |
| 140 | second insulating layer |
| 150 | solder glass |
| 160 | cap |

-continued

MICROMECHANICAL MAGNETIC FIELD SENSOR

List of Reference Symbols:

| | |
|---|---|
| 170 | third conducting layer |
| 175 | bonding pad base |
| 180 | bonding pad opening |
| 200 | magnetic field sensor structure |
| 210 | calibration current loop |
| 220 | bonding pads |
| 230 | patterned metal layer, fifth conducting layer |
| 240 | buried polysilicon layer, fourth conducting layer |
| 250 | oxide layer |
| 260 | epitaxial polysilicon layer |
| 270 | buried masking layer |
| 280 | epitaxial polysilicon layer |
| I | measuring current |
| $i_E$ | calibration current |

What is claimed is:

1. A micromechanical magnetic field sensor, comprising:

a substrate;

a printed circuit trace device suspended above the substrate and being able to be deflected elastically;

a first capacitor plate device joined to the printed circuit trace device and being able to be deflected together with the printed circuit trace device;

a second, fixed capacitor plate device joined to the substrate and forming a capacitor device by interacting with the first capacitor plate device; and a magnetic field sensing device for conducting a predetermined current through the printed circuit trace device and for measuring a change in a capacitance of the capacitor device arising as a function of an applied magnetic field, and further comprising:

a plurality of spring devices, wherein:

the printed circuit trace device includes a first elongated beam running in a first direction, the first elongated beam is elastically suspended above the substrate by arranging a first end of the first elongated beam in one of the plurality of spring devices and by arranging a second end of the first elongated beam in another one of the plurality of spring devices, and the first elongated beam is able to be deflected in a second direction only.

2. The micromechanical magnetic field sensor according to claim 1, wherein:

the printed circuit trace device includes:

a second beam branching from the first elongated beam in a first direction above the substrate, and a third beam branching from the first elongated beam in a second direction above the substrate and that is opposite to the first direction, and wherein the second beam and the third beam are associated with a uniform electrical potential of a branching point from the printed circuit trace device.

3. The micromechanical magnetic field sensor according to claim 2, wherein:

the first capacitor plate device includes a plurality of beams branching from the second beam and the third beam and running over the substrate according to an orientation that is one of parallel and vertical with respect to the first elongated beam.

4. The micromechanical magnetic field sensor according to claim 2, wherein:

an electrical potential corresponding to a uniform electrode potential is tapped at an end of at least one of the second beam and the third beam which is distant from an end of the first elongated beam.

5. The micromechanical magnetic field sensor according to claim 1, wherein:

the second capacitor plate device includes a plurality of beams anchored in the substrate at one end thereof and arranged according to a configuration such that the plurality of beams of the second capacitor plate device forms a differential capacitor device with respect to the first capacitor plate device.

6. The micromechanical magnetic field sensor according to claim 1, further comprising:

an arrangement for conducting a direct current through the printed circuit trace device and for sensing the applied magnetic field via a static change in the capacitance.

7. The micromechanical magnetic field sensor according to claim 1, further comprising:

conducting an alternating current through the printed circuit trace device and sensing the applied magnetic field via a dynamic change in the capacitance, and wherein the alternating current having a natural frequency of the printed circuit trace device and the first capacitor plate device.

8. The micromechanical magnetic field sensor according to claim 1, further comprising:

a conductive layer deposited at least on the first elongated beam of the printed circuit trace device, the conductive layer corresponding to one of a doped epitaxial polysilicon layer and an aluminum layer.

9. The micromechanical magnetic field sensor according to claim 1, further comprising:

a calibration current loop provided on the substrate and for impressing a calibrating magnetic field.

10. The micromechanical magnetic field sensor according to claim 1, further comprising:

a third capacitor plate device wherein the third capacitor plate device forms an additional capacitor device with respect to the first capacitor plate device; and sensing a change in the capacitance of the additional capacitor device arising as a function of the applied magnetic field.

11. The micromechanical magnetic field sensor according to claim 10, further comprising:

a cap provided over the substrate, wherein:

the third capacitor plate device includes a fourth conducting layer located in the substrate and a fifth conducting layer located on the cap.

12. The micromechanical magnetic field sensor according to claim 11, wherein:

the fifth conducting layer is patterned such that the fifth conducting layer is removed from an interconnecting region between the substrate and the cap.

13. A process for manufacturing a micromechanical magnetic field sensor, comprising the steps of:

(a) providing and patterning a first insulating layer on a substrate;

(b) providing and patterning a first conducting layer on the patterned first insulating layer;

(c) providing and patterning a second insulating layer on the patterned first conducting layer;

(d) providing and patterning a second conducting layer on the patterned second insulating layer to form a printed circuit trace device and a capacitor device;

(e) undercutting deflectable components from at least one of the first insulating layer and the second insulating layer, and (f) forming, electrical connections for the printed circuit trace device and for the capacitor device from the patterned first conducting layer.

14. The process according to claim 13, further comprising the step of:

encapsulating the deflectable components.

15. The process according to claim 13, further comprising the steps of:

providing a cap; and applying and patterning a further conducting layer on the cap.

16. A micromechanical magnetic field sensor, comprising:

a substrate;

a printed circuit trace device freely suspended above the substrate and being able to be deflected elastically;

a first capacitor plate device extending from the printed circuit trace device and being able to be deflected together with the printed circuit trace device;

a second capacitor plate device on the substrate and forming a capacitor device by interacting with the first capacitor plate device; and a magnetic field sensing device for conducting a predetermined current through the printed circuit trace device and for measuring a change in a capacitance of the capacitor device arising as a function of an applied magnetic field.

17. The micromechanical magnetic field sensor of claim 16, wherein the second capacitor plate device on the substrate is secured to the substrate at one end.

18. The micromechanical magnetic field sensor of claim 16, wherein the second capacitor plate device on the substrate is fixed to the substrate.

* * * * *

UNITED STATES PATENT AND TRADEMARK OFFICE
CERTIFICATE OF CORRECTION

PATENT NO.   : 6,215,318 B1
DATED        : April 10, 2001
INVENTOR(S)  : Schoefthaler et al.

It is certified that error appears in the above-identified patent and that said Letters Patent is hereby corrected as shown below:

Column 2,
Line 9, change "Fall" to -- Hall --.

Column 12,
Line 39, change "device" to -- device, --.

Signed and Sealed this

Twentieth Day of August, 2002

Attest:

Attesting Officer

JAMES E. ROGAN
Director of the United States Patent and Trademark Office